United States Patent
Kim et al.

(10) Patent No.: US 7,643,355 B2
(45) Date of Patent: Jan. 5, 2010

(54) SEMICONDUCTOR MEMORY DEVICE AND METHOD OF INPUTTING/OUTPUTTING DATA

(75) Inventors: Joung-Yeal Kim, Yongin-si (KR); Jeong-Don Lim, Seongnam-si (KR); Sung-Hoon Kim, Seongnam-si (KR); Woo-Jin Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/896,722

(22) Filed: Sep. 5, 2007

(65) Prior Publication Data

US 2008/0056018 A1   Mar. 6, 2008

(30) Foreign Application Priority Data

Sep. 5, 2006   (KR) .................... 10-2006-0085168

(51) Int. Cl.
*G11C 7/00* (2006.01)
(52) U.S. Cl. .................... 365/189.05; 365/230.03
(58) Field of Classification Search ............ 365/189.05, 365/230.03
See application file for complete search history.

(56) References Cited

U.S. PATENT DOCUMENTS

| | | | | |
|---|---|---|---|---|
| 5,686,913 | A * | 11/1997 | Coln et al. ................. | 341/51 |
| 5,687,296 | A * | 11/1997 | Shimada ..................... | 358/1.2 |
| 6,525,981 | B2 * | 2/2003 | Ryan ........................ | 365/223 |
| 6,947,334 | B2 * | 9/2005 | Shin ........................ | 365/189.16 |
| 2002/0103840 | A1 * | 8/2002 | Park et al. ................. | 708/493 |
| 2002/0191461 | A1 * | 12/2002 | Keeth ....................... | 365/200 |
| 2003/0048668 | A1 * | 3/2003 | Keeth et al. ................ | 365/189.05 |
| 2003/0135697 | A1 * | 7/2003 | La .......................... | 711/137 |
| 2003/0163606 | A1 * | 8/2003 | Fukaishi et al. ............. | 710/1 |
| 2004/0162935 | A1 * | 8/2004 | Janzen ...................... | 711/105 |
| 2005/0083758 | A1 * | 4/2005 | Ryan et al. ................. | 365/222 |
| 2005/0141330 | A1 * | 6/2005 | Shin ........................ | 365/233 |
| 2007/0192599 | A1 * | 8/2007 | Kato et al. ................. | 713/168 |

FOREIGN PATENT DOCUMENTS

| | | |
|---|---|---|
| JP | 2001-202787 | 7/2001 |
| KR | 10-2001-0003995 | 1/2001 |
| KR | 10-2001-0106584 | 12/2001 |
| KR | 10-2004-0104286 | 12/2004 |

OTHER PUBLICATIONS

ISSCC 2006/Session 8/ DRAM and TCAM/ 8.4.

* cited by examiner

*Primary Examiner*—Michael T Tran
(74) *Attorney, Agent, or Firm*—Harness, Dickey & Pierce, P.L.C.

(57) ABSTRACT

According to an example embodiment, a semiconductor memory device may include a memory core, input circuit, and/or an output circuit. The input circuit may be configured to generate second data from first data using latch circuits operating in response to input control signals enabled during different periods. The input circuit may be further configured to provide the second data to the memory core. The second data may have 2N times the number of bits of the first data, where N is a positive integer. The output circuit may be configured to generate fourth data from third data using latch circuits operating in response to output control signals enabled during different periods. The output circuit may be further configured to provide the fourth data to data output pins. The fourth data may have ½N times the number of bits of the third data. A method of inputting/outputting data is also provided.

30 Claims, 16 Drawing Sheets

SEMICONDUCTOR MEMORY DEVICE AND METHOD OF INPUTTING/OUTPUTTING DATA

PRIORITY STATEMENT

This application claims priority under 35 U.S.C. § 119 to Korean Patent Application No. 2006-85168, filed on Sep. 5, 2006, in the Korean Intellectual Property Office (KIPO), the entire contents of which are incorporated herein by reference.

BACKGROUND

1. Field

Example embodiments are directed to a semiconductor memory device, for example, an input circuit and an output circuit of a semiconductor memory device and a method of inputting/outputting data in a semiconductor memory device.

2. Description of Related Art

A memory device may generally refer to a device for storing data and commands, temporarily or permanently, so the stored data may be used in a computer, a communication system or an image processing system, for example. Recently, semiconductor memory devices have become a widely used memory device among various types of memory devices, including semiconductor devices, a magnetic tape, magnetic disks, optical devices, etc.

Semiconductor memory devices may include Dynamic Random Access Memory (DRAM), Static Random Access Memory (SRAM), Flash Memory and Read Only Memory (ROM), which may be classified according to types of storing data. Storage capacity and operating speed of semiconductor memory devices have also been increasing.

DRAM devices may be classified into Single Data Rate (SDR) DRAM, Double Rata Rate (DDR) DRAM, DDR3 DRAM and Graphic DDR3 (GDDR4) according to a pre-fetch mode. SDR DRAM may pre-fetch one-bit data and process the pre-fetched one-bit data. DDR DRAM may pre-fetch two-bit data and simultaneously process the pre-fetched two-bit data. DDR3 DRAM may pre-fetch four-bit data and simultaneously process the pre-fetched four-bit data. GDDR4 DRAM may pre-fetch eight-bit data and simultaneously process the pre-fetched eight-bit data. DRAM devices may simultaneously process more bits of data as the operating speed increases.

In a semiconductor memory device having a multi-bit pre-fetch scheme, internal circuit blocks may increase as the number of bits for pre-fetching increases.

FIGS. 1-4 are diagrams schematically illustrating output paths and operation timings of a conventional semiconductor device.

Referring to FIG. 1 and FIG. 3, eight-bit data corresponding to output data of an input/output sense amplifier may be transmitted to input/output pin DQj through eight output lines (GIO). An output path of the conventional semiconductor memory device in FIG. 1 may include a buffer operating in response to a control signal P0 and a multiplexer operating in response to a pre-fetch address signal. A semiconductor memory device having an X32 data input/output structure may require 256 output lines. As the number of output lines increases, the number of circuits coupled to the output lines may similarly increase.

Referring to FIG. 2 and FIG. 4, the semiconductor memory device may include clocked latches operating in response to clock signals P0 and P1 in an output terminal of the input/output sense amplifier. The semiconductor memory device may also include four output lines (GIO), whereby the semiconductor memory device may output four-bit data based on eight-bit data in response to a clock signal P0, and output the other four-bit data based on the eight-bit data in response to another clock signal P1. The output circuit in FIG. 2 may include multiplexers operating in response to pre-fetch address signals and clocked latches operating in response to control signals P0 and P1 having different phases from each other. Thus, the output circuit of the semiconductor memory device in FIG. 2 may output the first four-bit data based on the eight-bit data, and then output the other four-bit data based on the eight-bit data in response to clock signals having different phases.

A method of outputting data of the semiconductor memory device in FIG. 2, however, may require complex multiplexers and complex clock signal processing for generating eight-bit data through two output lines. In addition, a method of outputting data of the semiconductor memory device in FIG. 2 may require complex multiplexers and complex clock signal processing for generating sixteen-bit data through four output lines.

SUMMARY

Example embodiments are directed to a semiconductor memory device for inputting/outputting data.

According to an example embodiment, a semiconductor memory device may include a memory core, input circuit, and/or an output circuit. The input circuit may be configured to generate second data from first data using latch circuits operating in response to input control signals enabled during different periods. The input circuit may be further configured to provide the second data to the memory core. The second data may have 2N times the number of bits of the first data, where N is a positive integer. The output circuit may be configured to generate fourth data from third data using latch circuits operating in response to output control signals enabled during different periods. The output circuit may be further configured to provide the fourth data to data output pins. The fourth data may have ½N times the number of bits of the third data.

According to another example embodiment, a method of inputting/outputting data of semiconductor device may include generating second data from first data using latch circuits operating in response to input control signals enabled during different periods. The second data may have 2N times the number of bits of the first data. The second data may be provided to a memory core. Fourth data may be generated from third data using latch circuits operating in response to output control signals enabled during different periods. The fourth data may have ½N times a number of bits of the third data. The fourth data may be provided to data output pins.

Thus, the number of input/output lines and a chip size of the semiconductor memory device implemented in an IC may be reduced.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
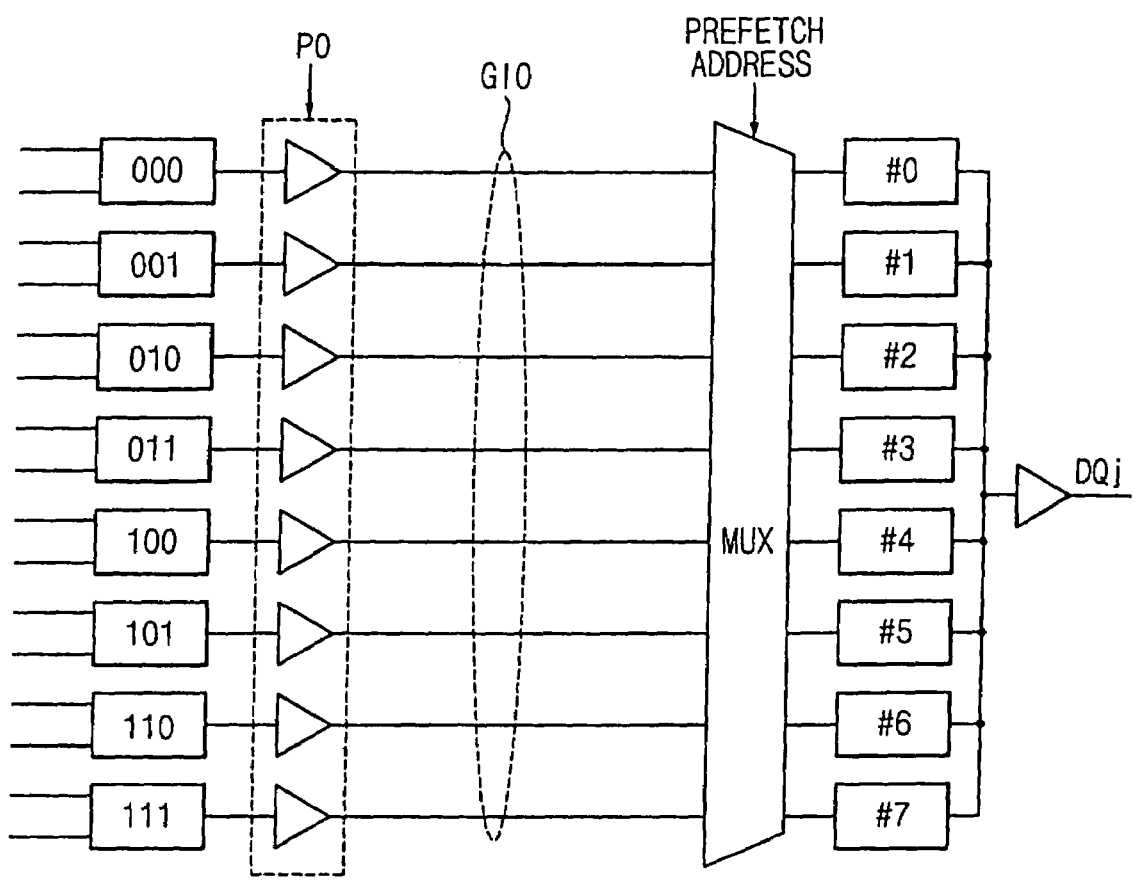
FIG. 1 is a diagram schematically illustrating example output paths of a conventional semiconductor memory device.
Figure 2:
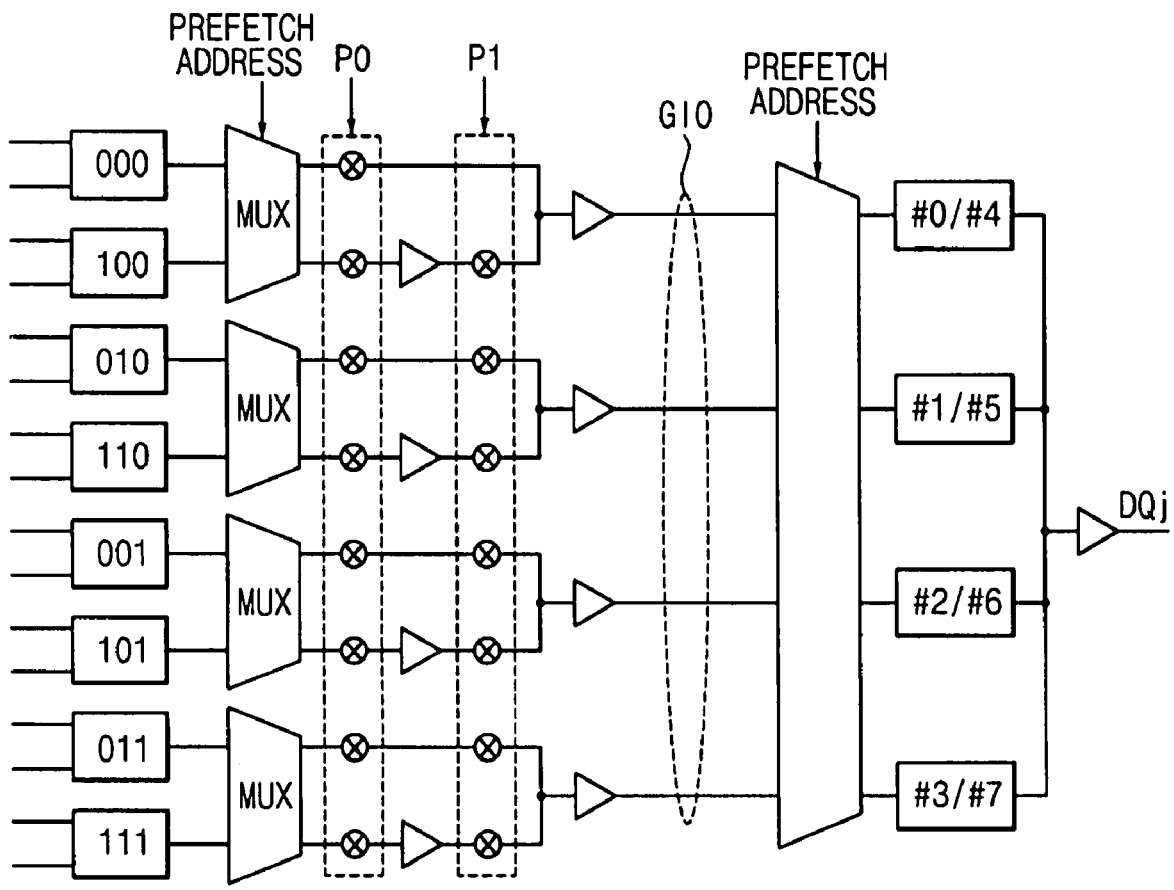
FIG. 2 is a diagram schematically illustrating other example output paths of a conventional semiconductor memory device.
Figure 3:
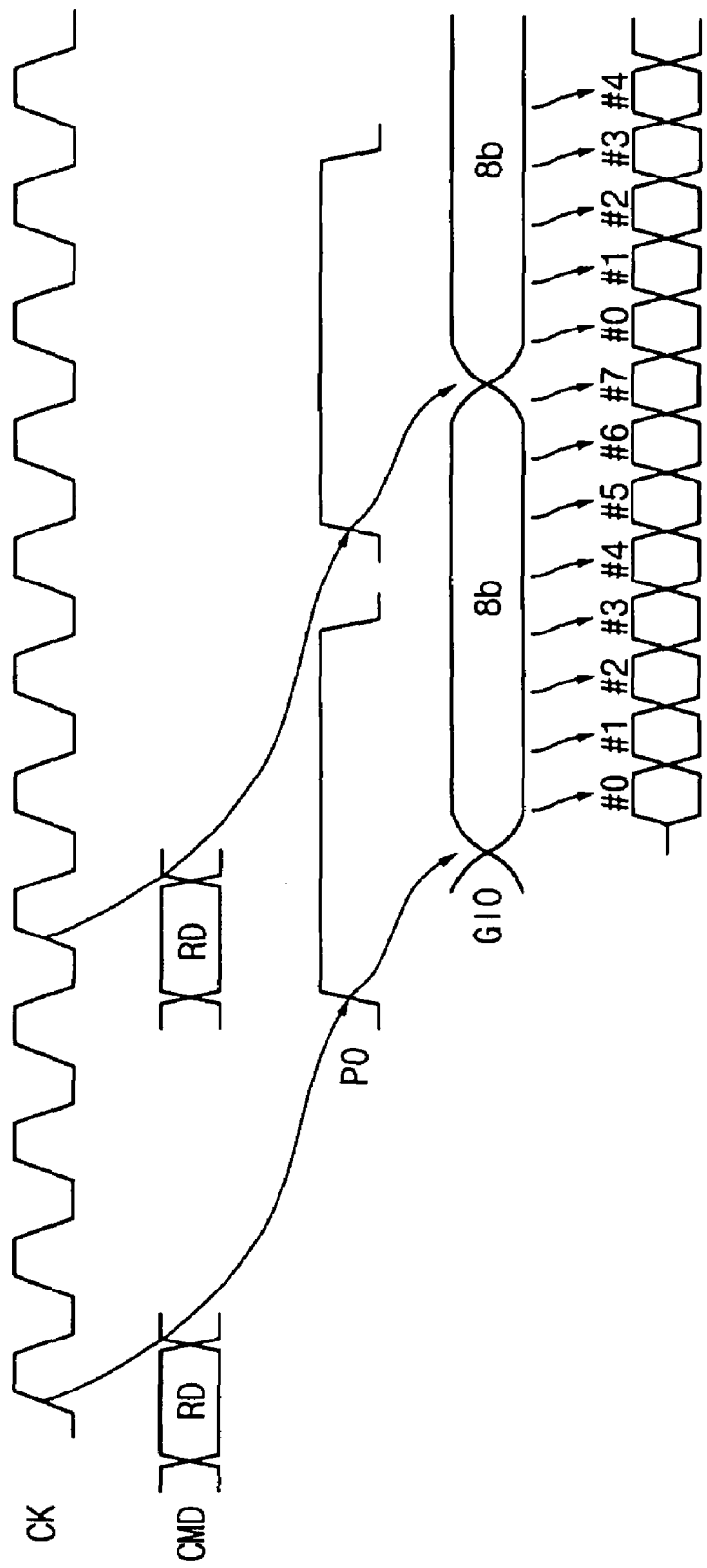
FIG. 3 is a timing diagram illustrating an operation of the circuit in FIG. 1.
Figure 4:
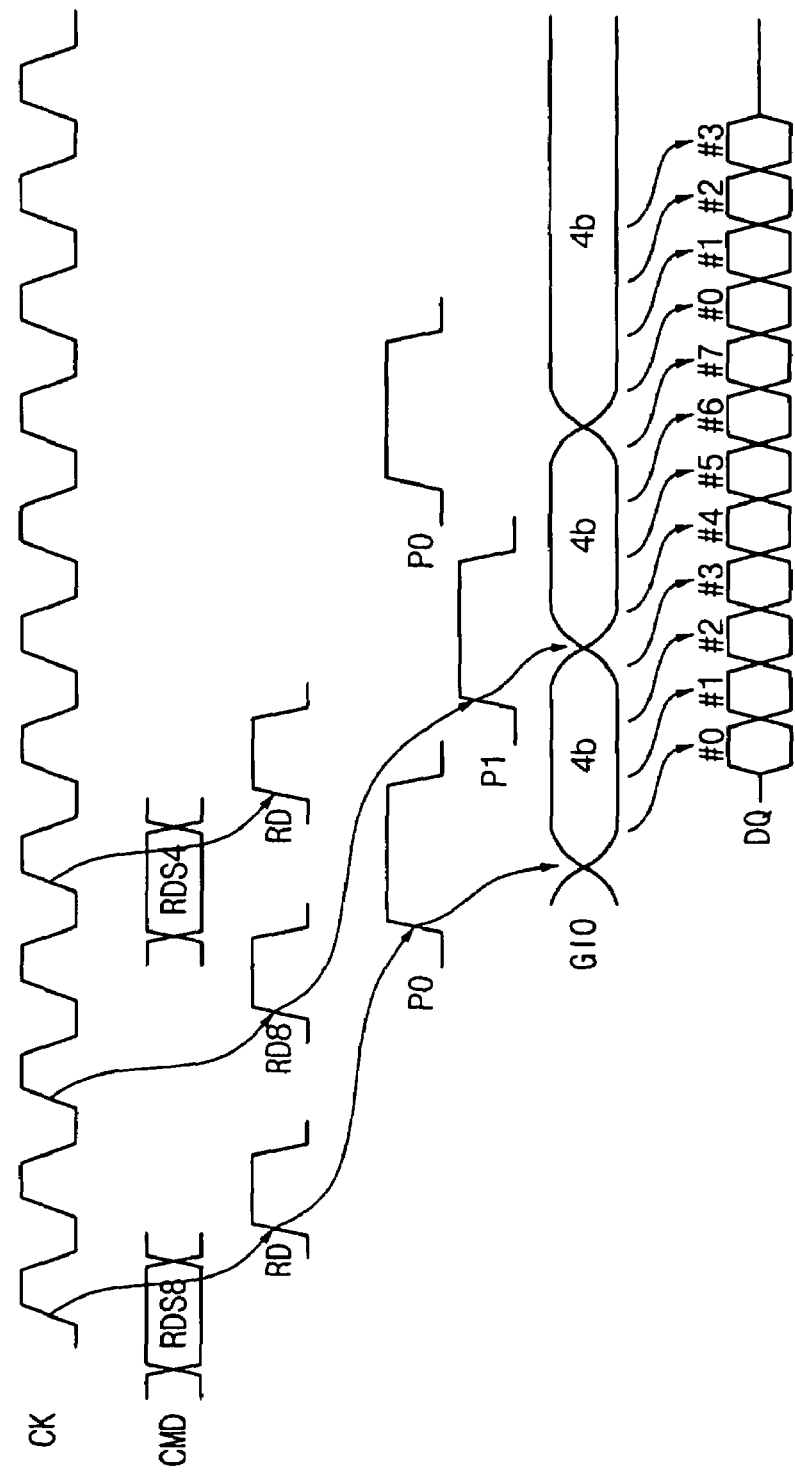
FIG. 4 is a timing diagram illustrating an operation of the circuit in FIG. 2.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 5:
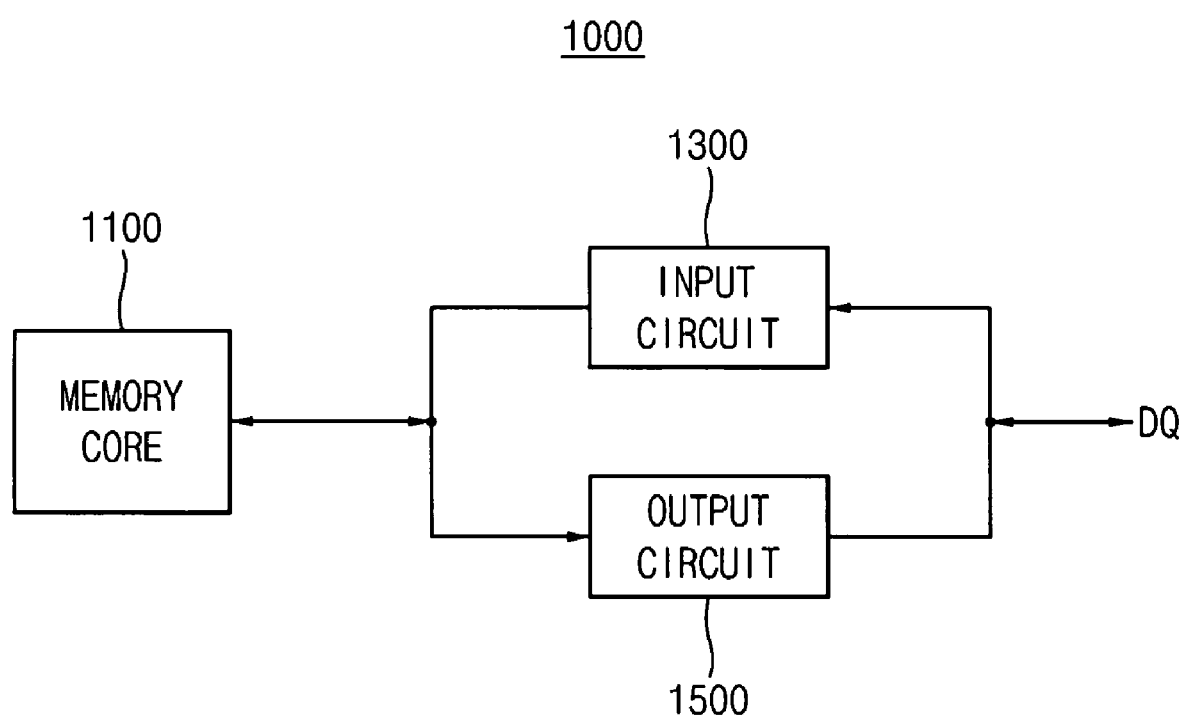
FIG. 5 is a block diagram illustrating a semiconductor memory device according to an example embodiment.

FIG. 5 is a block diagram illustrating a semiconductor memory device according to an example embodiment.

Referring to FIG. 5, the semiconductor memory device 1000 may include a memory core 1100, an input circuit 1300 and/or an output circuit 1500.

The memory core 1100 may include a memory cell array. The memory core 1100 may store data provided through input/output pins DQ in the memory cell array. The memory core 1100 may output data stored in the memory cell array through input/output pins DQ.

The input circuit 1300 may generate second data from first data using latch circuits operating in response to input control signals, and may provide the second data to the memory core 1100. The input control signals may be enabled during different periods. The number of bits of the second data may substantially correspond to 2N (where N is a positive integer) times the number of bits of the first data. The output circuit 1500 may generate fourth data from third data using latch circuits operating in response to output control signals, which may be enabled during different periods. The output circuit 1500 may provide the fourth data to data output pins DQ. The number of bits of the fourth data may substantially correspond to ½N (where N is a positive integer) times of the number of bits of the third data provided from the memory core 1100. The input circuit 1300 and the output circuit 1500 may not include multiplexers in input/output paths.

Figure 6:
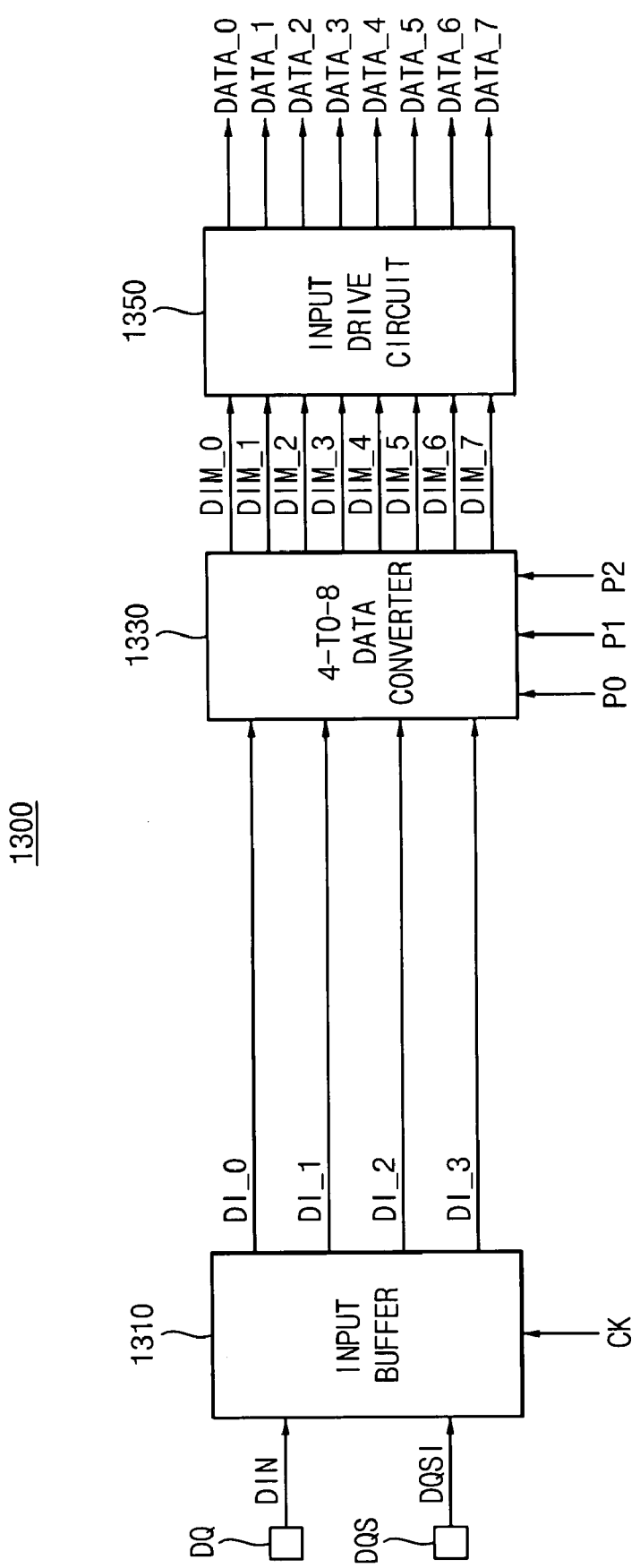
FIG. 6 is a circuit diagram illustrating an example input circuit of the semiconductor memory device shown in FIG. 5.

FIG. 6 is a circuit diagram illustrating an example input circuit 1300 included in the semiconductor memory device 1000 shown in FIG. 5.

Referring to FIG. 6, the input circuit 1300 may include an input buffer 1310, a data converter 1330, and/or an input drive circuit 1350.

The input buffer 1310 may receive input data DIN through the input/output pins DQ. The input buffer 1310 may receive a write DQS signal DQSI through data strobe pin DQS. The input buffer 1310 may sample the input data DIN in response to the write DQS signal DQSI. The input buffer 1310 may generate first data DI_0, DI_1, DI_2 and DI_3 having a plurality of bits by converting the sampled serial data to parallel data. The data converter 1330 may generate second data DIM_0, DIM_1, DIM_2, DIM_3, DIM_4, DIM_5, DIM_6 and DIM_7 based on the first data DI_0, DI_1, DI_2 and DI_3 using latch circuits operating in response to input control signals P0, P1 and P2. The input drive circuit 1350 may generate data DATA_0, DATA_1, DATA_2, DATA_3, DATA_4, DATA_5, DATA_6 and DATA_7 in response to the second data DIM_0, DIM_1, DIM_2, DIM_3, DIM_4, DIM_5, DIM_6 and DIM_7 to drive the memory core 1100.

Hereinafter, example operations of the input circuit 1300 in FIG. 6 will be described in more detail.

The input circuit 1300 in FIG. 6 may generate 8-bit data DATA_0, DATA_1, DATA_2, DATA_3, DATA_4, DATA_5, DATA_6 and DATA_7 based on the input data DIN sequentially provided through the input/output pins DQ. The input circuit 1300 may provide the generated 8-bit data DATA_0, DATA_1, DATA_2, DATA_3, DATA_4, DATA_5, DATA_6 and DATA_7 to the memory core 1100. The input circuit 1300 may be included in a semiconductor memory device for a pre-fetch data process, for example. The data converter 1330 may be a four-to-eight data converter for converting four-bit data to eight-bit data, for example. The data converter 1330 may receive the four bits of first data DI_0, DI_1, DI_2 and DI_3 provided from the input buffer 1310 via four data lines, and may generate the eight bits of second data DIM_0, DIM_1, DIM_2, DIM_3, DIM_4, DIM_5, DIM_6 and DIM_7 therefrom.

The input circuit 1300 according to an example embodiment as shown in FIG. 6 may include latches operating in response to input control signals P0, P1 and P2. The input circuit 1300 may transmit the first data DI_0, DI_1, DI_2 and DI_3 having four bits using four data lines constituting a majority of the path between the input buffer 1310 and the input drive circuit 1350. As illustrated in FIG. 6, the data converter 1330 may be located near the input drive circuit 1350 to lengthen the four data transmission lines. Thus, a chip size of the semiconductor memory device including the input circuit according to an example embodiment may be reduced.

Figure 7:
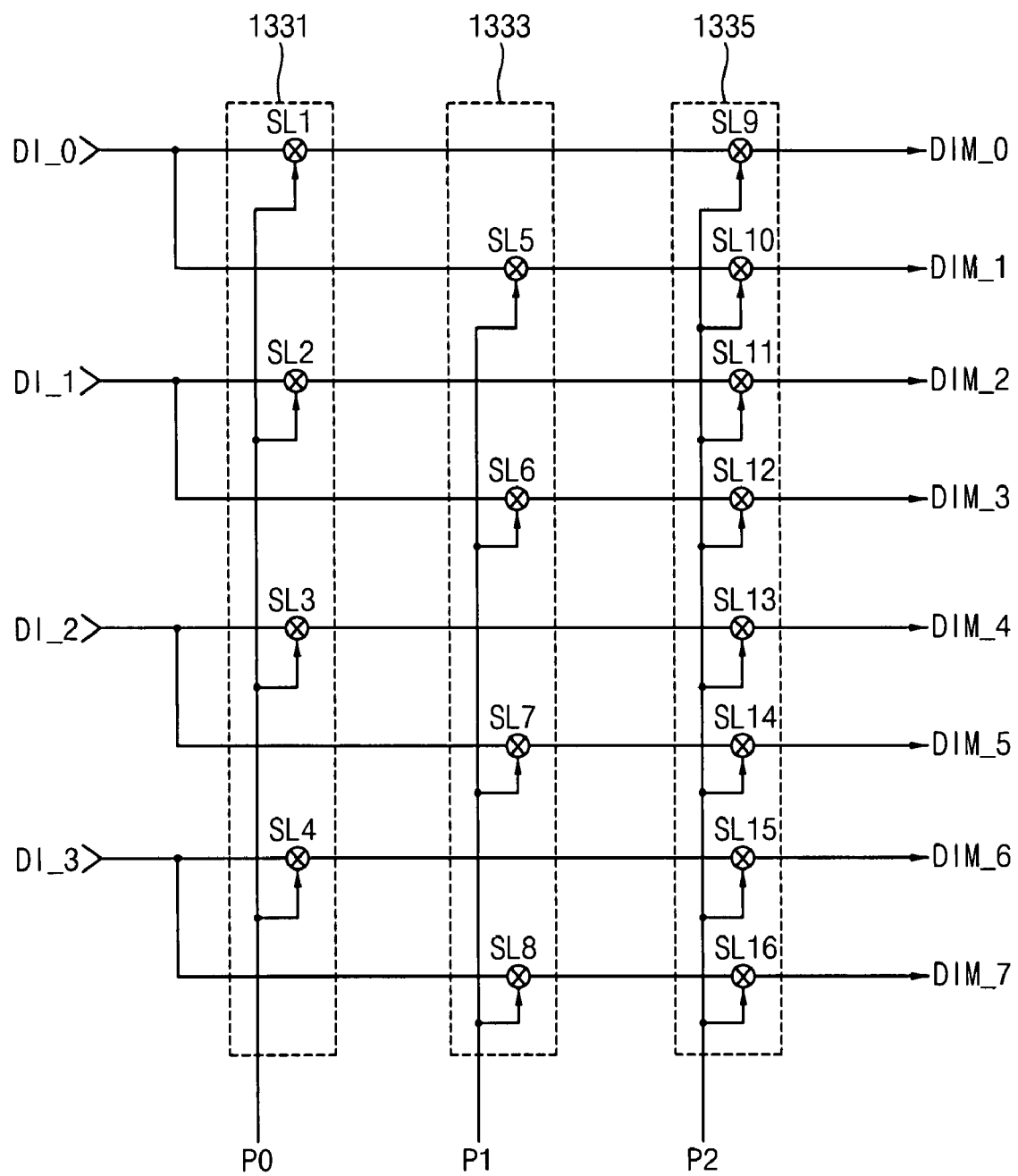
FIG. 7 is a circuit diagram illustrating an example data converter of the input circuit shown in FIG. 6.

FIG. 7 is a circuit diagram illustrating an example data converter included in the input circuit shown in FIG. 6

Referring to FIG. 7, the data converter 1330 may include a first latch circuit 1331, a second latch circuit 1333, and/or a third latch circuit 1335.

The first latch circuit 1331 may include clocked latches SL1 through SL4. The first latch circuit 1331 may latch each bit of the first data DI_0, DI_1, DI_2 and DI_3 in response to the first input control signal P0. The second latch circuit 1333 may include clocked latches SL5 through SL8. The second latch circuit 1333 may latch each bit of the first data DI_0, DI_1, DI_2 and DI_3 in response to a second input control signal P1. The third latch circuit 1335 may include clocked latches SL9 through SL16. The third latch circuit 1335 may latch output signals of the first and second latch circuits 1331 and 1333 in response to a third input control signal P2. The third latch circuit 1335 may output the second data DIM_0 through DIM_7.

Hereinafter, example operations of the data converter shown in FIG. 7 will be described.

The data converter 1330 including the first latch circuit 1331, the second latch circuit 1333 and the third latch circuit 1335 may generate the second data DIM_0, DIM_1, DIM_2, DIM_3, DIM_4, DIM_5, DIM_6 and DIM_7 having eight bits based on the first data DI_0, DI_1, DI_2 and DI_3 having four bits. The first input control signal P0 and the second input control signal P1 may be distinct two clock signals enabled during different periods. For example, the first input control signal P0 and second input control signal P1 may be generated from one clock signal such that the first input control signal P0 and second input control signal P1 have opposing phases. The order of enabling the first input control signal P0 and the second input control signal P1 may be reversed. For example, a pulse of the second input control signal P1 may be generated later than a pulse of the first input control signal P0, or the pulse of the first input control signal P0 may be generated later than the pulse of the second input control signal P1.

When the first input control signal P0 is enabled, the clocked latches SL1 through SL4 included in the first latch circuit 1331 may latch the first data DI_0, DI_1, DI_2 and DI_3 provided in a first clock cycle. When the second input control signal P1 is enabled, the clocked latches SL5 through SL8 included in the second latch circuit 1333 may latch the first data DI_0, DI_1, DI_2 and DI_3 provided in a second clock cycle. Data values of the first data DI_0, DI_1, DI_2 and DI_3 provided in the first clock cycle may be different from data values of the first data DI_0, DI_1, DI_2 and DI_3 provided in the second clock cycle. The first data having eight bits latched by the clocked latches SL1 through SL4 included in the first latch circuit 1331 and the clocked latches SL5 through SL8 included in the second latch circuit 1333 may be latched by the clocked latches SL9 through SL16 included in the third latch circuit 1335 when the third input control signal P2 is enabled. The second data DIM_0, DIM_1, DIM_2, DIM_3, DIM_4, DIM_5, DIM_6 and DIM_7 having eight bits may be generated by the data converter 1330 during the two clock cycles. Then, the second data DIM_0, DIM_1, DIM_2, DIM_3, DIM_4, DIM_5, DIM_6 and DIM_7 may be provided to the input drive circuit 1350 in FIG. 6.

Figure 8:
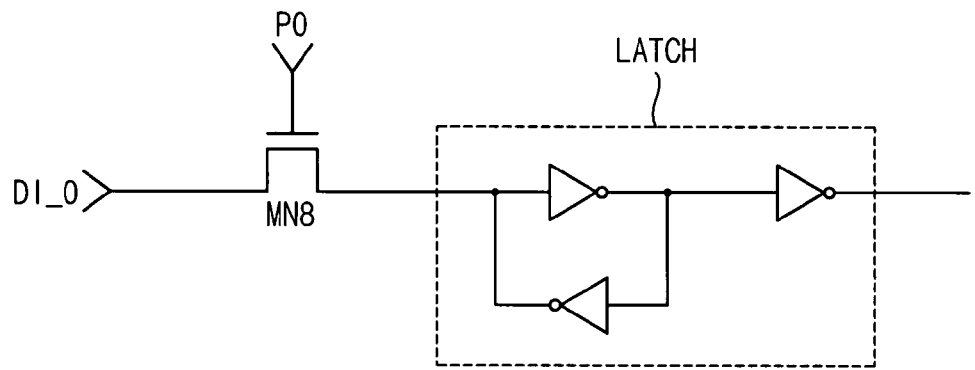
FIG. 8 is a circuit diagram illustrating an example clocked latch of the data converter shown in FIG. 7.

FIG. 8 is a circuit diagram illustrating an example clocked latch included in the data converter shown in FIG. 7. Referring to FIG. 8, the clock latch SL1a may include an NMOS transistor NM8 for transmitting one bit DI_0 of the first data and a latch for latching an output signal of the NMOS transistor MN8.

Figure 9:
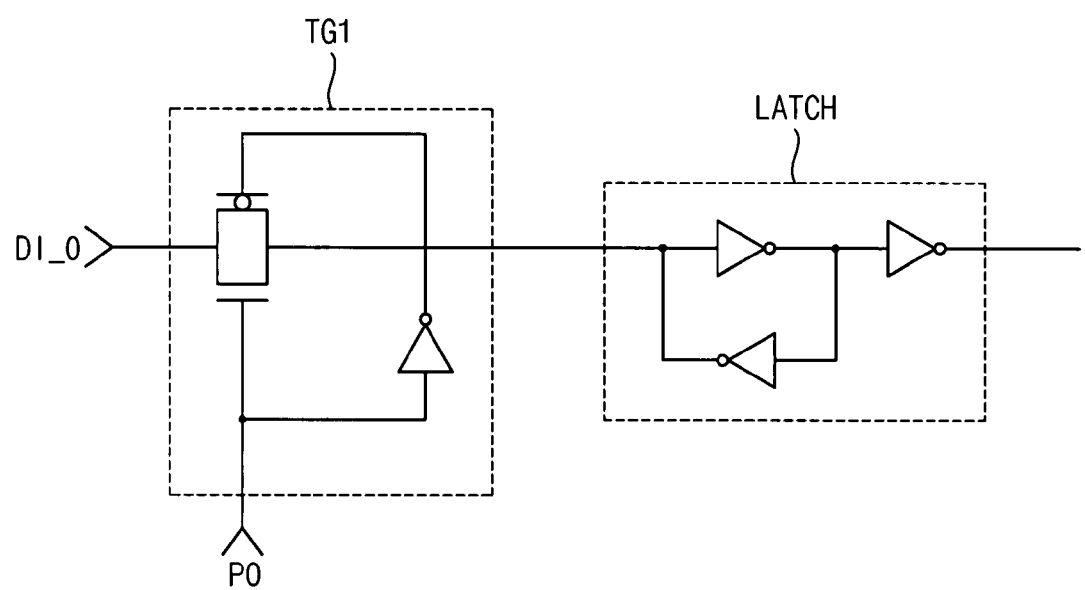
FIG. 9 is a circuit diagram illustrating another example clocked latch of the data converter shown in FIG. 7.

FIG. 9 is a circuit diagram illustrating another example clocked latch included in the data converter shown in FIG. 7. Referring to FIG. 9, the clock latch SL1b may include a transmission gate TG1 for transmitting one bit DI_0 of the first data and a latch for latching an output signal of the transmission gate TG1. The NMOS transistor in FIG. 8 and the latch in FIG. 9 may each perform switching operations.

The clocked latches SL1 through SL16 included in the data converter shown in FIG. 7 may include circuits having similar structures to the clocked latches illustrated in FIG. 8 or FIG. 9. The clocked latches SL1 through SL4 included in the first latch circuit 1331 may operate when the first input control signal P0 is enabled. The clocked latches SL5 through SL8 included in the second latch circuit 1333 may operate when the second input control signal P1 is enabled. The clocked latches SL9 through SL16 included in the first latch circuit 1335 may operate when the third input control signal P2 is enabled.

Figure 10:
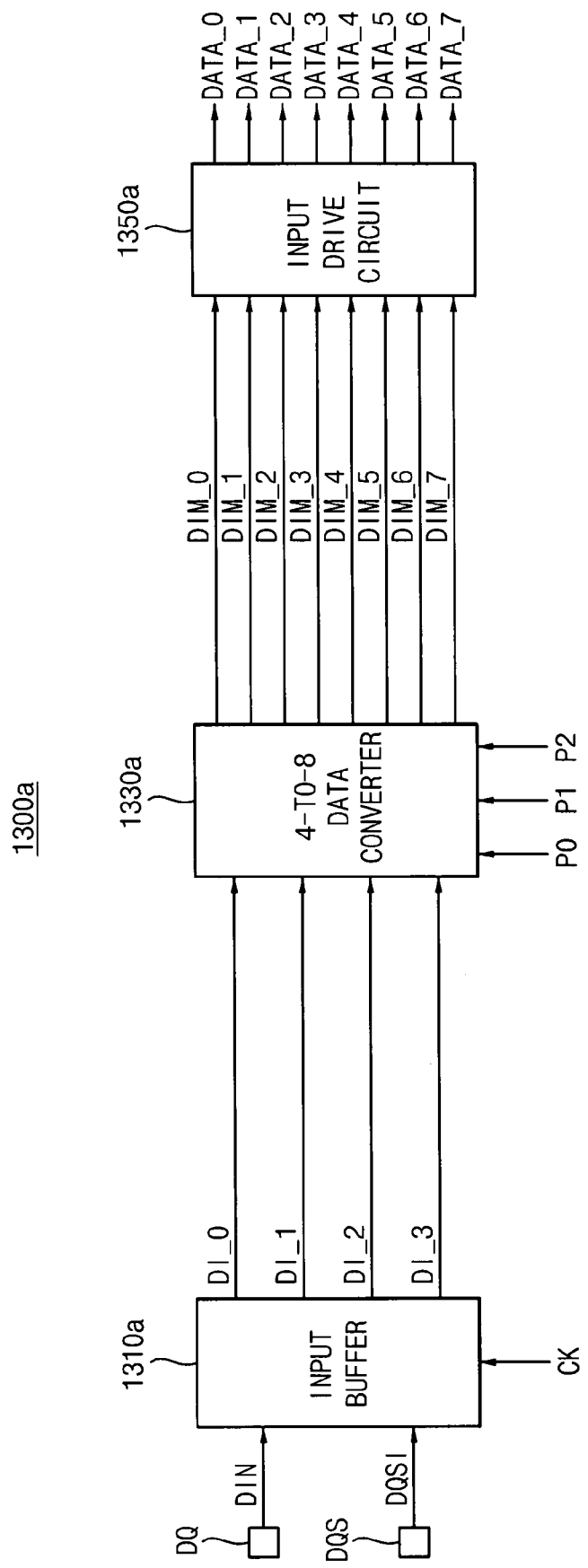
FIG. 10 is a circuit diagram illustrating another example input circuit of the semiconductor memory device shown in FIG. 5.

FIG. 10 is a circuit diagram illustrating another example input circuit included in the semiconductor device shown in FIG. 5.

Referring to FIG. 10, the input circuit 1300a may have a similar structure to the input circuit 1300 shown in FIG. 6. The location of data converter 1330a in FIG. 10, however, may be different from the location of the data converter 1330 in FIG. 6.

The data converter 1330 in FIG. 6 may be located near to the input drive circuit 1350. The data converter 1330a in FIG. 10, however, may be located significantly further from the input drive circuit 1350a as compared to the data converter 1330 in FIG. 6. For example, the data converter 1330a may be located near a repeater circuit. When it is difficult to implement the data converter 1330a near the input drive circuit 1350*a* in a semiconductor memory integrated circuit, the data converter 1330*a* may be located relatively far from the input buffer 1310*a* and the input drive circuit 1350*a*.

Figure 11:
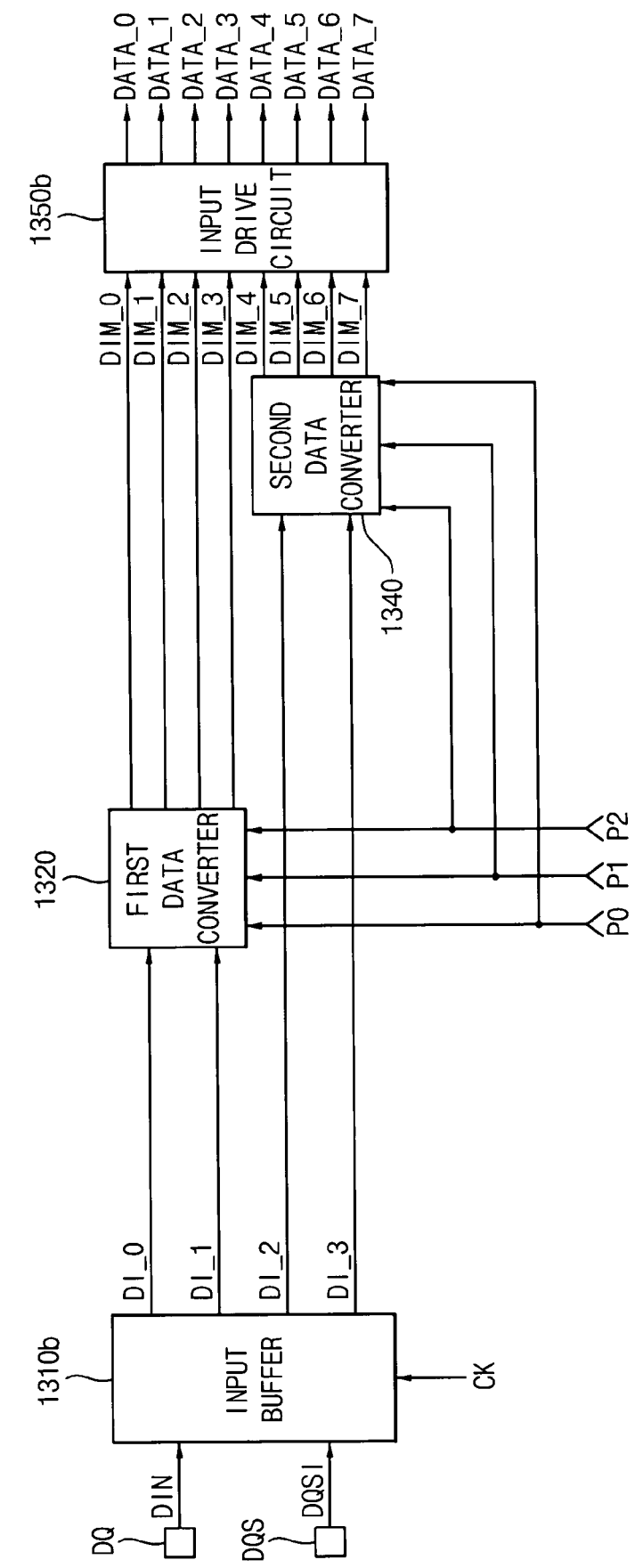
FIG. 11 is a circuit diagram illustrating another example input circuit of the semiconductor memory device shown in FIG. 5.

FIG. 11 is a circuit diagram illustrating another example input circuit included in the semiconductor device shown in FIG. 5.

Referring to FIG. 11, the input circuit 1300*b* may include an input buffer 1310*b*, a first data converter 1320, a second data converter 1340, and an input drive circuit 1350*b*.

The input buffer 1310*b* may sample the input data DIN in response to the write DQS signal DQSI. The input buffer 1310*b* may generate first data DI_0, DI_1, DI_2 and DI_3 having a plurality of bits by converting the sampled serial data to parallel data. The first data converter 1320 may generate portions of bits of the second data DIM_0, DIM_1, DIM_2 and DIM_3 based on first bits of the first data DI_0 and DI_1 using latch circuits operating in response to input control signals P0, P1 and P2. The second data converter 1340 may generate the rest of the bits of the second data DIM_4, DIM_5, DIM_6 and DIM_7 based on second bits of the first data DI_2 and DI_3 using latch circuits operating in response to input control signals P0, P1 and P2. The input drive circuit 1350*b* may generate data DATA_0, DATA_1, DATA_2, DATA_3, DATA_4, DATA_5, DATA_6 and DATA_7 in response to the second data DIM_0, DIM_1, DIM_2, DIM_3, DIM_4, DIM_5, DIM_6 and DIM_7 to drive the memory core 1100.

Hereinafter, example operations of the input circuit 1300*b* will be described.

The input circuit 1300*b* shown in FIG. 11 may include the first data converter 1320 and the second data converter 1340. The first data converter 1320 may be located relatively far from the input drive circuit 1350*b*. The first data converter 1320 may be located near the input drive circuit 1350*b*. For example, the first data converter 1320 may be located near a repeater circuit.

The first data converter 1320 may generate portions of bits of the second data DIM_0, DIM_1, DIM_2 and DIM_3 based on the first bits of the first data DI_0 and DI_1 in response to input control signals P0, P1 and P2. The second data converter 1340 may generate the rest of the bits of the second data DIM_4, DIM_5, DIM_6 and DIM_7 based on the second bits of the first data DI_2 and DI_3 in response to input control signals P0, P1 and P2. An input circuit 1300*b* with the structure illustrated in FIG. 11 may be used for various circuit allocations in an integrated circuit.

Figure 12:
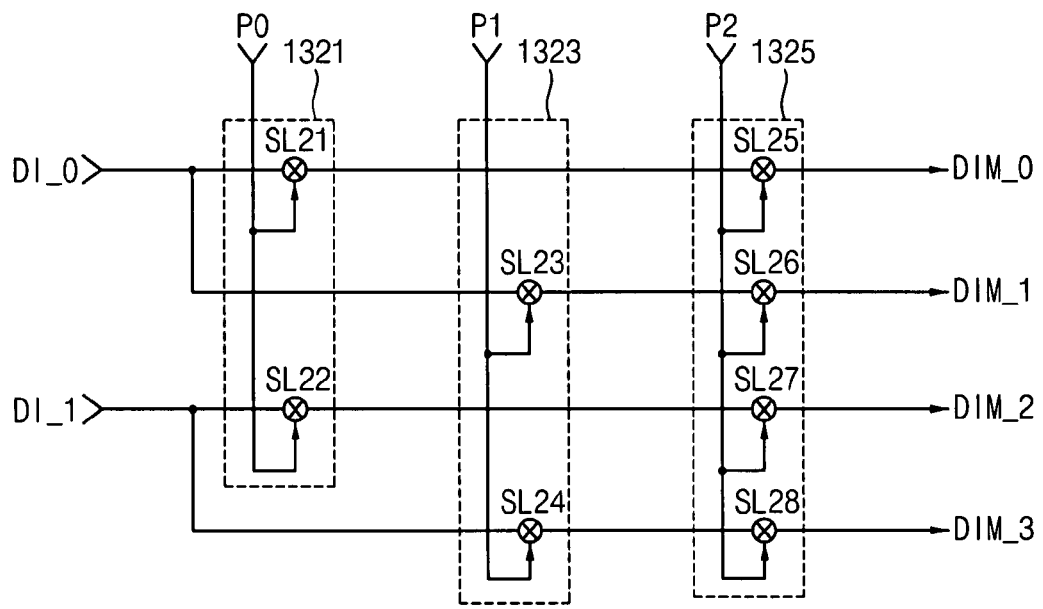
FIG. 12 is a circuit diagram illustrating an example first data converter of the input circuit shown in FIG. 11.

FIG. 12 is a circuit diagram illustrating an example first data converter 1320 included in the input circuit shown in FIG. 11.

Referring to FIG. 12, the first data converter 1320 may include a first latch circuit 1321, a second latch circuit 1323 and/or a third latch circuit 1325.

The first latch circuit 1321 may latch the first bits of the first data DI_0 and DI_1 in response to a first input control signal P0. The second latch circuit 1323 may latch the second bits of the first data DI_0 and DI_1 in response to a second input control signal P1. The third latch circuit 1325 may latch an output signal of the first latch circuit 1321 and an output signal of the second latch circuit 1323 in response to a third input control signal P2. The third latch circuit 1325 may generate portions of bits of the second data DIM_0, DIM_1, DIM_2 and DIM_3.

Hereinafter, example operations of the first data converter 1320 shown in FIG. 12 will be described.

When the first input control signal P0 is enabled, the clocked latches SL21 and SL22 included in the first latch circuit 1321 may latch the first bits of the first data DI_0 and DI_1 provided in a first clock cycle. When the second input control signal P1 is enabled, the clocked latches SL23 and SL24 included in the second latch circuit 1323 may latch the first bits of the first data DI_0 and DI_1 provided in a second clock cycle. Data values of the first bits of the first data DI_0 and DI_1 provided in the first clock cycle may be different from data values of the first bits of the first data DI_0 and DI_1 provided in the second clock cycle. The first bits of the first data having four bits latched by the clocked latches SL21 and SL22 included in the first latch circuit 1321 and the clocked latches SL23 and SL24 included in the second latch circuit 1323 may be latched by the clocked latches SL25 through SL28 included in the third latch circuit 1335 when the third input control signal P2 is enabled. The portions of bits of the second data DIM_0, DIM_1, DIM_2 and DIM_3 having four bits may be generated by the first data converter 1320 during the two clock cycles. The portions of the second data DIM_0, DIM_1, DIM_2 and DIM_3 may be provided to the input drive circuit 1350*b* in FIG. 11.

Figure 13:
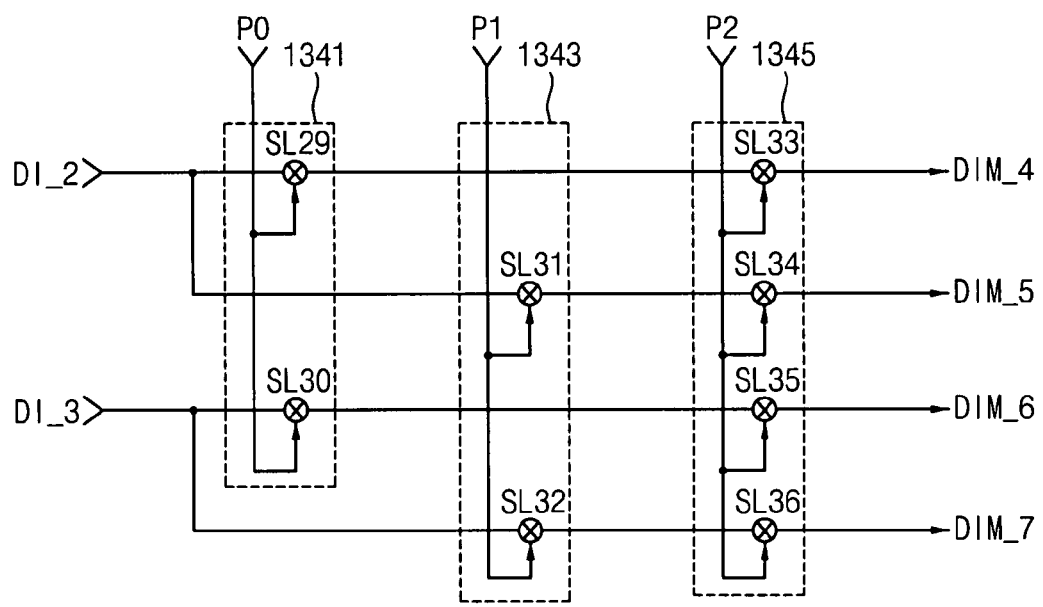
FIG. 13 is a circuit diagram illustrating an example second data converter of the input circuit shown in FIG. 11.

FIG. 13 is a circuit diagram illustrating an example second data converter 1340 included in the input circuit shown in FIG. 11.

Referring to FIG. 13, the second data converter 1340 may include a fourth latch circuit 1341, a fifth latch circuit 1343 and/or a sixth latch circuit 1345.

The fourth latch circuit 1341 may latch the second bits of the first data DI_2 and DI_3 in response to the first input control signal P0. The fifth latch circuit 1343 may latch the second bits of the first data DI_2 and DI_3 in response to-the second input control signal P1. The sixth latch circuit 1345 may latch an output signal of the fourth latch circuit 1341 and an output signal of the second latch circuit 1343 in response to a third input control signal P2. The sixth latch circuit 1325 may generate the rest of the bits of the second data DIM_4, DIM_5, DIM_6 and DIM_7.

Hereinafter, example operations of the second data converter 1340 shown in FIG. 13 will be described.

When the first input control signal P0 is enabled, the clocked latches SL29 and SL30 included in the fourth latch circuit 1341 may latch the second bits of the first data DI_2 and DI_3 provided in the first clock cycle. When the second input control signal P1 is enabled, the clocked latches SL31 and SL32 included in the fifth latch circuit 1343 may latch the second bits of the first data DI_2 and DI_3 provided in the second clock cycle. Data values of the second bits of the first data DI_0 and DI_1 provided in the first clock cycle may be different from data values of the second bits of the first data DI_2 and DI_3 provided in the second clock cycle. The second bits of the first data having four bits latched by the clocked latches SL29 and SL30 included in the fourth latch circuit 1341 and the clocked latches SL31 and SL32 included in the fifth latch circuit 1343 may be latched by the clocked latches SL33 through SL36 included in the sixth latch circuit 1345 when the third input control signal P2 is enabled. The rest of the bits of the second data DIM_4, DIM_5, DIM_6 and DIM_7 having four bits may be generated by the second data converter 1340 during the two clock cycles. The rest of the bits of the second data DIM_4, DIM_5, DIM_6 and DIM_7 may subsequently be provided to the input drive circuit 1350*b* shown in FIG. 11.

Figure 14:
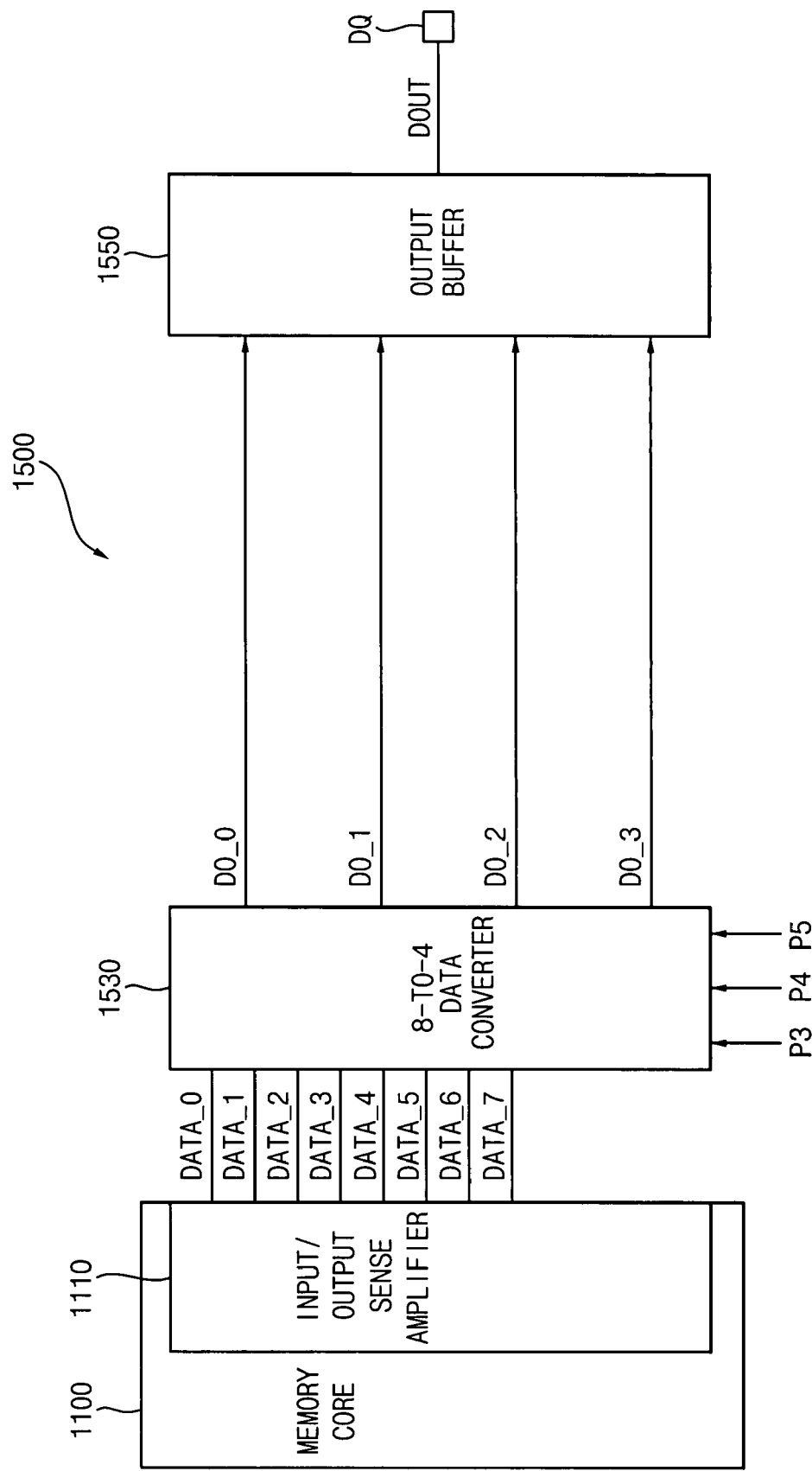
FIG. 14 is a circuit diagram illustrating an example output circuit of the semiconductor memory device shown in FIG. 5.

FIG. 14 is a circuit diagram illustrating an example output circuit included in the semiconductor device shown in FIG. 5.

Referring to FIG. 14, the output circuit 1500 may include a data converter 1530 and/or an output buffer 1550.

The data converter 1530 may generate fourth data DO_0, DO_1, DO_2 and DO_3 based on third data DATA_0, DATA_1, DATA_2, DATA_3, DATA_4, DATA_5, DATA_6 and DATA_7 provided from the memory core 1100 using latch circuits operating in response to output control signals P3, P4 and P5. The output buffer 1550 may determine the output order of the fourth data DO_0, DO_1, DO_2 and DO_3. The output buffer 1550 may convert parallel data to serial data to generate output data DOUT. The output data DOUT from the output buffer 1550 may be output outside the semiconductor chip through the input/output pins DQ.

Hereinafter, example operations of the output circuit 1500 shown in FIG. 14 will be described.

The output circuit 1500 shown in FIG. 14 may generate fourth data DO_0, DO_1, DO_2 and DO_3 based on the third data DATA_0, DATA_1, DATA_2, DATA_3, DATA_4, DATA_5, DATA_6 and DATA_7 provided from an input/output sense amplifier 1110 included in the memory core 1100, for example. Output data DOUT may be provided to a device located external to the semiconductor chip. The output circuit in FIG. 14 may be included in a semiconductor memory device operating in a data processing mode of eight-bit pre-fetch, for example. The data converter 1530 may be an eight-to-four data converter for converting eight-bit data to four-bit data, for example. The data converter 1530 may receive the third data DATA_0, DATA_1, DATA_2, DATA_3, DATA_4, DATA_5, DATA_6 and DATA_7 having eight bits provided from the input/output sense amplifier through eight data lines. The data converter 1530 may subsequently generate the fourth data DO_0, DO_1, DO_2 and DO_3.

The output circuit 1500 according to an example embodiment as illustrated in FIG. 14 may include the data converter 1530 including latches operating in response to output control signals P3, P4 and P5. The output circuit 1500 may transmit the fourth data DO_0, DO_1, DO_2 and DO_3 having four bits using four data lines constituting the majority of the path between the input/output sense amplifier 1110 and the output buffer 1550. The data converter 1530 may be located relatively near the input/output sense amplifier 1110 to lengthen the four data transmission lines. Thus, a chip size of the semiconductor memory device including the output circuit according to an example embodiment may be reduced.

Figure 15:
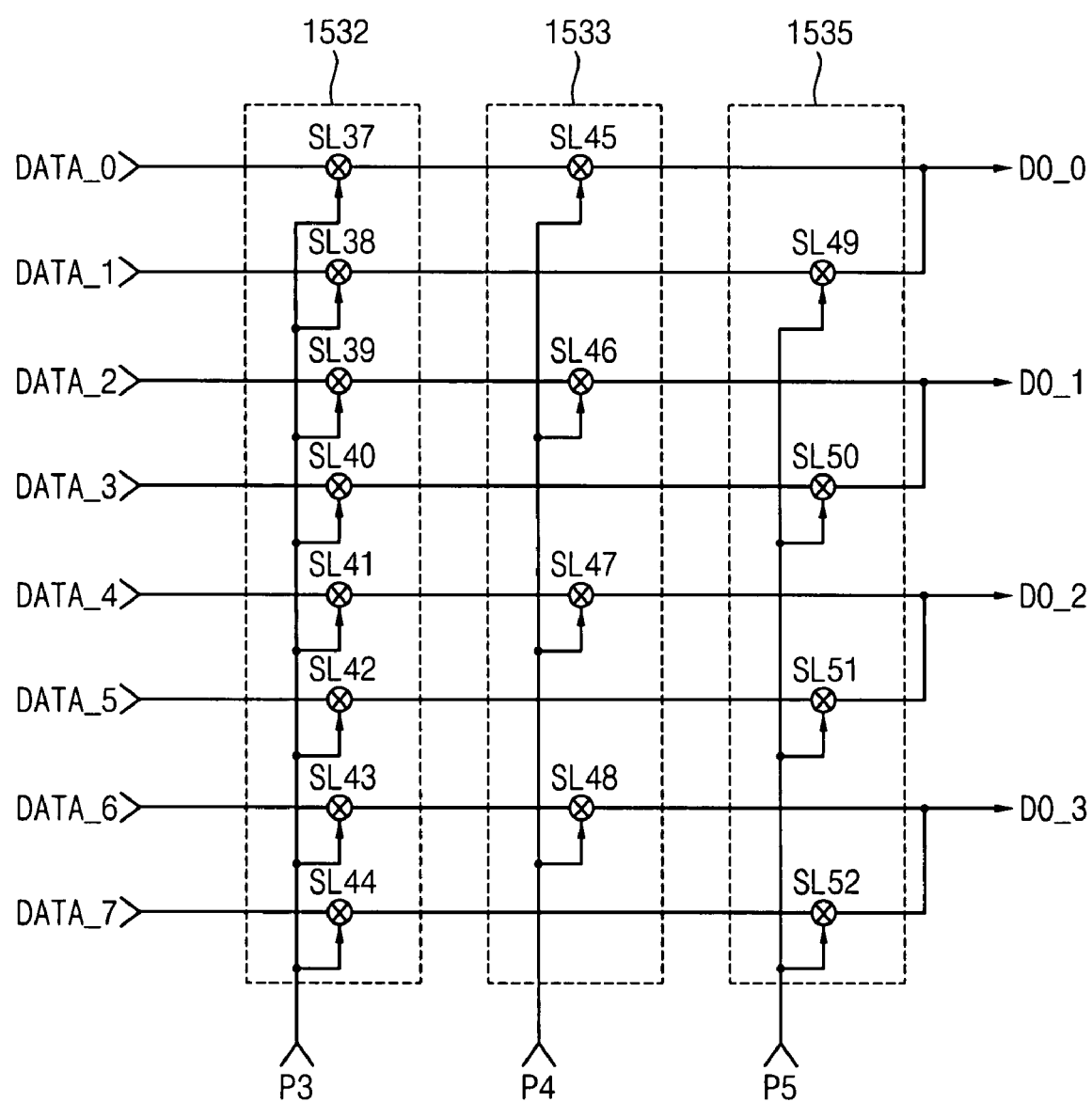
FIG. 15 is a circuit diagram illustrating an example data converter of the output circuit shown in FIG. 14.

FIG. 15 is a circuit diagram illustrating an example data converter included in the output circuit shown in FIG. 14.

Referring to FIG. 15, the data converter 1530 may include a first latch circuit 1532, a second latch circuit 1533 and/or a third latch circuit 1535.

The first latch circuit 1532 may latch each bit of the third data DATA_0, DATA_1, DATA_2, DATA_3, DATA_4, DATA_5, DATA_6 and DATA_7 in response to the first output control signal P3. The second latch circuit 1533 may latch even-numbered bits of the third data DATA_0, DATA_2, DATA_4 and DATA_6 in response to the second output control signal P4. The third latch circuit 1535 may latch odd-numbered bits of the third data DATA_1, DATA_3, DATA_5 and DATA_7 in response to the third output control signal P5. Output lines coupled to the second latch circuit 1533 may be electrically coupled to output lines coupled to the third latch circuit. The fourth data DO_0, DO_1, DO_2 and DO_3 may be provided through nodes coupled to the second latch circuit 1533 and the third latch circuit 1535.

Hereinafter, example operations of the data converter 1540 in FIG. 15 will be described.

When the first output control signal P3 is enabled, the clocked latches SL37 through SL44 included in the first latch circuit 1532 may latch each bit of the first data DATA_0, DATA_1, DATA_2, DATA_3, DATA_4, DATA_5, DATA_6 and DATA_7. When the second output control signal P4 is enabled, the clocked latches SL45 through SL48 included in the second latch circuit 1533 may latch output data of the clocked latches SL37, SL39, SL41 and SL43 included in the first latch circuit 1532. When the third output control signal P5 is enabled, the clocked latches SL49 through SL52 included in the third latch circuit 1535 may latch output data of the clocked latches SL38, SL40, SL42 and SL44 included in the first latch circuit 1532. The data converter 1530 may generate the fourth data DO_0, DO_1, DO_2 and DO_3 having four bits during one clock cycle, for example. The data converter 1530 may generate the fourth data DO_0, DO_1, DO_2 and DO_3 having eight bits during two clock cycles, for example.

The second output control signal P4 and the third output control signal P5 may be distinct two clock signals enabled during different periods. For example, the second output control signal P4 and the third output control signal P5 may be generated from one clock signal such that the second output control signal P4 and the third output control signal P5 have opposite phases. The order of enabling the second output control signal P4 and the third output control signal P5 may be changed. For example, a pulse of the third output control signal P5 may be generated later than a pulse of the second output control signal P4, or the pulse of the second output control signal P4 may be generated later than the pulse of the third output control signal P5.

Figure 16:
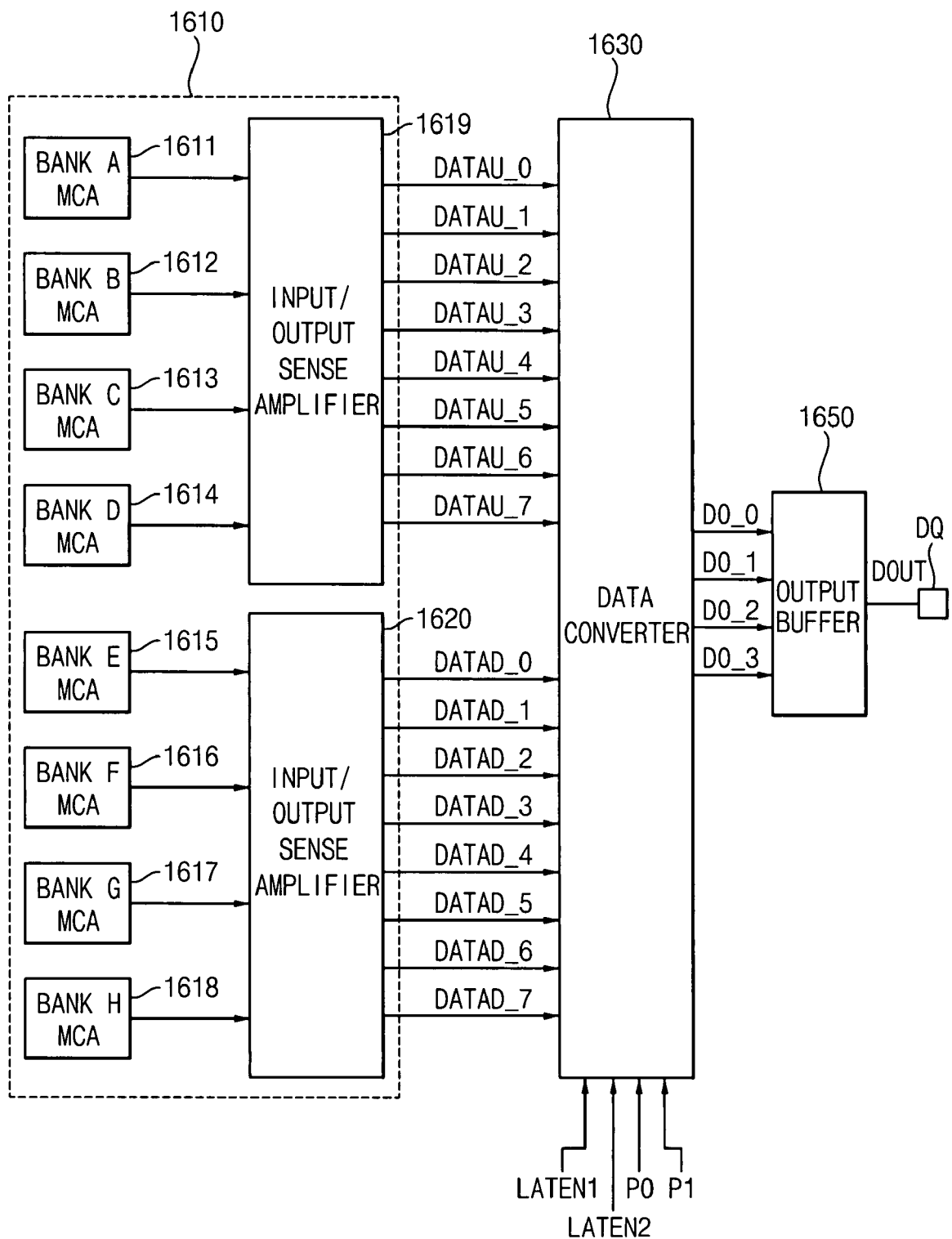
FIG. 16 is a circuit diagram illustrating another example output circuit shown in FIG. 5.

FIG. 16 is a circuit diagram illustrating another example output circuit shown in FIG. 5. The output circuit 1600 in FIG. 16 corresponds to the output circuit 1500 in FIG. 5.

The output circuit 1600 may include memory cell arrays of eight banks 1611 through 1618 and first and second input/output sense amplifiers 1619 and 1620. The first input/output sense amplifier 1619 may amplify data stored in memory cells of first banks 1611 through 1614 in the memory core 1610. The second input/output sense amplifier 1620 may amplify data stored in memory cells of second banks 1615 through 1618 in the memory core 1610.

Referring to FIG. 16, the output circuit 1600 may include a data converter 1630 and/or an output buffer 1650. The data converter 1630 may generate fourth data DO_0, DO_1, DO_2 and DO_3 based on fifth data DATAU_0, DATAU_1, DATAU_2, DATAU_3, DATAU_4, DATAU_5, DATAU_6 and DATAU_7 provided from the first input/output amplifier 1619 and sixth data DATAD_0, DATAD_1, DATAD_2, DATAD_3, DATAD_4, DATAD_5, DATAD_6 and DATAD_7 provided from the second input/output sense amplifier 1620 using latch circuits operating in response to output control signals P0 and P1 and input/output sense amplifier control signal LATEN1 and LATEN2. The output buffer 1650 may determine the output order of the fourth data DO_0, DO_1, DO_2 and DO_3. The output buffer 1650 may convert parallel data to serial data to generate output data DOUT. The output data DOUT of the output buffer may be provided to an outside device relative to the semiconductor chip through the input/output pins DQ.

More than the number of input/output sense amplifiers shown may be used as the number of memory banks included in the semiconductor memory device increases. The output circuit 1600 shown in FIG. 16 may include memory cell arrays of eight memory banks 1611 through 1618 and two input/output sense amplifiers 1619 and 1620. The data converter 1630 may receive the fifth data DATAU_0, DATAU_1, DATAU_2, DATAU_3, DATAU_4, DATAU_5, DATAU_6 and DATAU_7 provided from the first input/output amplifier 1619 and sixth data DATAD_0, DATAD_1, DATAD_2, DATAD_3, DATAD_4, DATAD_5, DATAD_6 and DATAD_7 provided from the second input/output sense amplifier 1620. The data converter 1630 may generate the fourth data DO_0, DO_1, DO_2 and DO_3 in response to the output control signals P0 and P1 and the input/output sense amplifier control signals LATEN1 and LATEN2.

Figure 17:
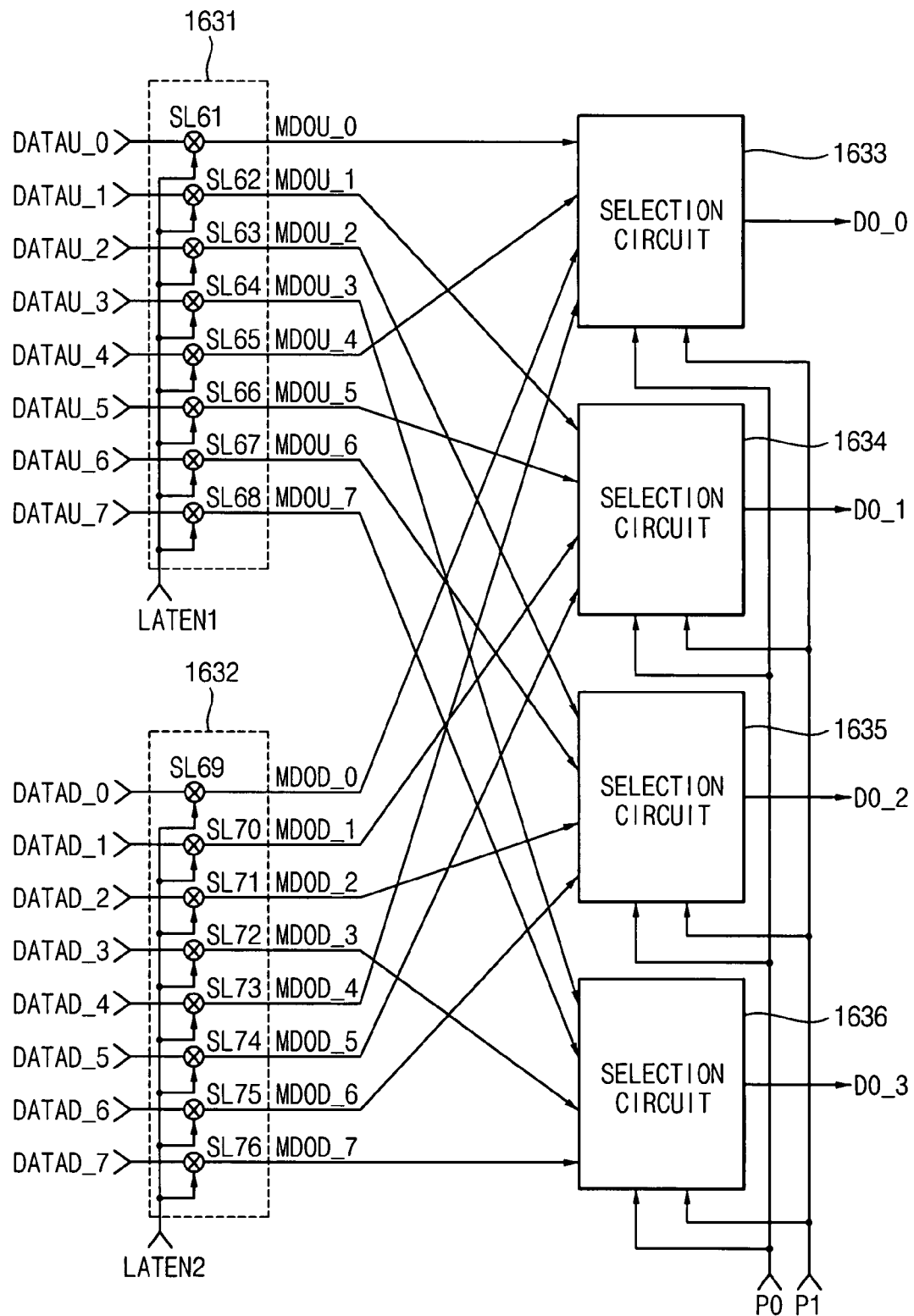
FIG. 17 is a circuit diagram illustrating an example data converter of the output circuit shown in FIG. 16.

FIG. 17 is a circuit diagram illustrating an example data converter included in the output circuit shown in FIG. 16.

Referring to FIG. 17, the data converter 1630 may include latch circuits 1631 and 1632 and selection circuits 1633 through 1636.

A first latch circuit 1631 may latch fifth data DATAU_0, DATAU_1, DATAU_2, DATAU_3, DATAU_4, DATAU_5, DATAU_6 and DATAU_7 in response to the first input/output sense amplifier control signal LATEN1 to generate first latch data MDOU_0, MDOU_1, MDOU_2, MDOU_3, MDOU_4, MDOU_5, MDOU_6 and MDOU_7. A second latch circuit 1632 may latch sixth data DATAD_0, DATAD_1, DATAD_2, DATAD_3, DATAD_4, DATAD_5, DATAD_6 and DATAD_7 in response to the second input/output sense amplifier control signal LATEN2 to generate second latch data MDOD_0, MDOD_1, MDOD_2, MDOD_3, MDOD_4, MDOD_5, MDOD_6 and MDOD_7.

Each selection circuit 1633 through 1636 may generate a corresponding bit of the fourth data DO_0, DO_1, DO_2 and DO_3 based on portions of the first latch data MDOU_0, MDOU_1, MDOU_2, MDOU_3, MDOU_4, MDOU_5, MDOU_6 and MDOU_7 and portions of second latch data MDOD_0, MDOD_1, MDOD_2, MDOD_3, MDOD_4, MDOD_5, MDOD_6 and MDOD_7 in response to the output control signals P0 and P1.

For example, as shown, a first selection circuit 1633 may select one bit from a first bit MDOU_0 and a fifth bit MDOU_4 of the first latch data, and a first bit MDOD_0 and a fifth bit MDOD_4 of the second latch data in response to the output control signals P0 and P1 to generate a first bit DO_0 of the fourth data. A second selection circuit 1634 may select one bit from a second bit MDOU_1 and a sixth bit MDOU_5 of the first latch data, and a second bit MDOD_1 and a sixth bit MDOD_5 of the second latch data in response to the output control signals P0 and P1 to generate a second bit DO_1 of the fourth data. A third selection circuit 1635 may select one bit from a third bit MDOU_2 and a seventh bit MDOU_6 of the first latch data, and a third bit MDOD_2 and a seventh bit MDOD_6 of the second latch data in response to the output control signals P0 and P1 to generate a third bit DO_2 of the fourth data. A fourth selection circuit 1636 may select one bit from a fourth bit MDOU_3 and an eighth bit MDOU_7 of the first latch data, and a fourth bit MDOD_3 and an eighth bit MDOD_7 of the second latch data in response to the output control signals P0 and P1 to generate a fourth bit DO_3 of the fourth data.

A first output control signal P0 and a second output control signal P1 in FIG. 17 may be distinct two clock signals enabled during different periods. For example, the first output control signal P0 and the second output control signal P1 may be generated from one clock signal such that the first output control signal P0 and the second output control signal P1 have opposite phases. The order of enabling the first output control signal P0 and the second output control signal P1 may be changed. For example, a pulse of the second output control signal P1 may be generated later than a pulse of the first output control signal P0, or the pulse of the first output control signal P0 may be generated later than the pulse of the second output control signal P1.

Figure 18:
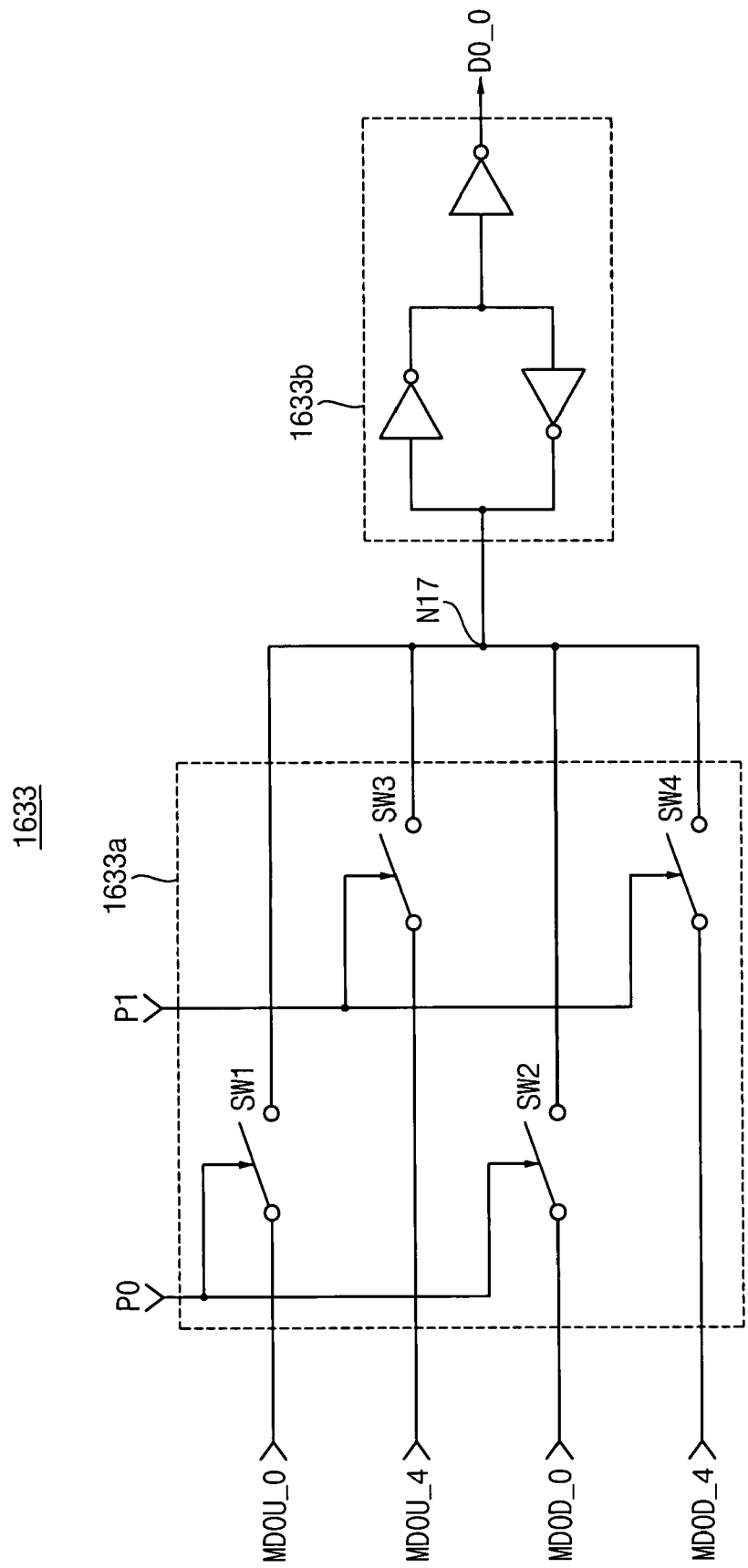
FIG. 18 is a circuit diagram illustrating example latch circuits of the data converter shown in FIG. 17.

FIG. 18 is a circuit diagram illustrating an example latch selection circuit included in the data converter shown in FIG. 17.

Referring to FIG. 18, one of the latch circuits 1633 may include a switch circuit 1633a and/or a latch 1633b.

The switch circuit 1633a may select one bit from the two bits MDOU_0 and MDOU_4 of the first latch data and the two bits MDOD_0 and MDOD_1 of the second latch data in response to the output control signals P0 and P1 to provide the selected bit to a node N17. The switch circuit 1633a may include a first switch SW1 and a second switch SW2 operating in response to the first output control signal P0. The switch circuit 1633a may further include a third switch SW3 and a fourth switch SW4 operating in response to the second output control signal P1. The latch 1633b may latch data of the node N17 and generate the first bit DO_0.

The selection circuits 1633 through 1636 shown in FIG. 17 may have similar structures to the selection circuit shown in FIG. 18.

With regard to the clock signals, the number of toggling clock signals may be (N/2)×M, when data is generated M-times in a semiconductor memory device having N-bit pre-fetch scheme. For example, four-bit data may be generated twice in a semiconductor memory device having eight-bit pre-fetch scheme.

In the above-described example embodiments, the semiconductor memory device may include the input circuit for converting four-bit data to eight-bit data and inputting the converted data to the memory core. The semiconductor memory device may also include the output circuit for converting eight-bit data to four-bit data and outputting the converted data. Example embodiments, however, may include semiconductor devices for converting data having an arbitrary number of bits As illustrated above, a semiconductor memory device according to an example embodiment may decrease the number of input lines and output lines using control signals enabled during different periods. Thus, a chip size of the semiconductor memory device implemented in a given IC may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device, comprising:
a memory core;
an input circuit configured to generate second data from first data using latch circuits operating in response to input control signals enabled during different periods, and configured to provide the second data to the memory core, the second data having 2N times a number of bits of the first data, where N is a positive integer; and
an output circuit configured to generate fourth data from third data using latch circuits operating in response to output control signals enabled during different periods, and configured to provide the fourth data to data output pins, the fourth data having ½N times a number of bits of the third data, wherein
the input circuit includes:
an input buffer configured to generate the first data by sampling serial input data in response to a write DQS signal and converting the sampled serial data to parallel data;
a data converter configured to generate the second data based on the first data using the latch circuits operating in response to the input control signals; and an input drive circuit configured to drive the memory core in response to the second data.

2. The semiconductor memory device of claim 1, wherein the data converter is located relatively near the input drive circuit.

3. The semiconductor memory device of claim 1, wherein the data converter is located relatively far from the input buffer and the input drive circuit.

4. The semiconductor memory device of claim 3, wherein the data converter is located relatively near a repeater circuit.

5. The semiconductor memory device of claim 1, wherein the data converter includes:
- a first latch circuit configured to latch each bit of the first data in response to a first input control signal;
- a second latch circuit configured to latch each bit of the first data in response to a second input control signal enabled later than the first input control signal; and
- a third latch circuit configured to latch output signals of the first latch circuit and output signals of the second latch circuit in response to a third input control signal.

6. The semiconductor memory device of claim 5, wherein the latched bits of the first data latched in response to the second input control signal correspond to data inputted later than the latched bits of the first data latched in response to the first input control signal.

7. The semiconductor memory device of claim 5, wherein the first latch circuit includes:
- a switch configured to transmit each bit of the first data in response to the first input control signal; and
- a latch configured to latch an output signal of the switch.

8. The semiconductor memory device of claim 7, wherein the switch includes an MOS transistor or a transmission gate.

9. The semiconductor memory device of claim 5, wherein the second latch circuit includes:
- a switch configured to transmit each bit of the first data in response to the second input control signal; and
- a latch configured to latch an output signal of the switch.

10. The semiconductor memory device of claim 9, wherein the switch includes an MOS transistor or a transmission gate.

11. A semiconductor memory device, comprising:
- a memory core;
- an input circuit configured to generate second data from first data using latch circuits operating in response to input control signals enabled during different periods, and configured to provide the second data to the memory core, the second data having 2N times a number of bits of the first data, where N is a positive integer; and
- an output circuit configured to generate fourth data from third data using latch circuits operating in response to output control signals enabled during different periods, and configured to provide the fourth data to data output pins, the fourth data having ½N times a number of bits of the third data, wherein
  the input circuit includes:
  - an input buffer configured to generate the first data having a plurality of bits by sampling serial input data in response to a write DQS signal and converting the sampled serial data to parallel data;
  - a first data converter configured to generate a portion of the bits of the second data based on first bits of the first data using latch circuits operating in response to the input control signals;
  - a second data converter configured to generate the remaining bits of the second data based on second bits of the first data using latch circuits operating in response to the input control signals; and
  - an input drive circuit configured to drive the memory core in response to the second data.

12. The semiconductor memory device of claim 11, wherein the first data converter is located relatively far from the input drive circuit, and the second data converter is located relatively near the input drive circuit.

13. The semiconductor memory device of claim 12, wherein the first data converter is located near to a repeater circuit.

14. The semiconductor memory device of claim 11, wherein the first data converter includes:
- a first latch circuit configured to latch the first bits of the first data in response to a first input control signal;
- a second latch circuit configured to latch the second bits of the first data in response to a second input control signal enabled later than the first input control signal; and
- a third latch circuit configured to latch an output signal of the first latch circuit and an output signal of the second latch circuit in response to a third input control signal.

15. The semiconductor memory device of claim 14, wherein the latched first bits of the first data latched in response to the second input control signal correspond to data inputted later than the latched first bits of the first data latched in response to the first input control signal.

16. The semiconductor memory device of claim 14, wherein the first latch circuit includes:
- a switch configured to transmit each bit of the first data in response to the first input control signal; and
- a latch configured to latch an output signal of the switch.

17. The semiconductor memory device of claim 14, wherein the switch includes an MOS transistor or a transmission gate.

18. The semiconductor memory device of claim 14, wherein the second latch circuit includes:
- a switch configured to transmit each bit of the first data in response to the second input control signal; and
- a latch configured to latch an output signal of the switch.

19. The semiconductor memory device of claim 18, wherein the switch includes an MOS transistor or a transmission gate.

20. The semiconductor memory device of claim 11, wherein the second data converter includes:
- a first latch circuit configured to latch the first bits of the first data in response to a first input control signal;
- a second latch circuit configured to latch the second bits of the first data in response to a second input control signal enabled later than the first input control signal; and
- a third latch circuit configured to latch an output signal of the first latch circuit and an output signal of the second latch circuit in response to a third input control signal.

21. The semiconductor memory device of claim 20, wherein the latched second bits of the first data latched in response to the second input control signal corresponds to data inputted later than the latched second bits of the first data latched in response to the first input control signal.

22. The semiconductor memory device of claim 20, wherein the first latch circuit includes:
- a switch configured to transmit each bit of the first data in response to the first input control signal; and
- a latch configured to latch an output signal of the switch.

23. The semiconductor memory device of claim 20, wherein the second latch circuit includes:
- a switch configured to transmit each bit of the first data in response to the second input control signal; and
- a latch configured to latch an output signal of the switch.

24. A semiconductor memory device, comprising:
a memory core;

an input circuit configured to generate second data from first data using latch circuits operating in response to input control signals enabled during different periods, and configured to provide the second data to the memory core, the second data having 2N times a number of bits of the first data, where N is a positive integer; and an output circuit configured to generate fourth data from third data using latch circuits operating in response to output control signals enabled during different periods, and configured to provide the fourth data to data output pins, the fourth data having ½N times a number of bits of the third data, wherein the output circuit includes:
 a data converter configured to generate the fourth data based on the third data outputted from the memory core using a latch circuit operating in response to the output control signals; and
 an output buffer configured to determine an output order of the fourth data and configured to convert parallel data to serial data.

25. The semiconductor memory device of claim 24, wherein the data converter includes:
 a first latch circuit configured to latch the third data in response to a first output control signal;
 a second latch circuit configured to latch even bits of the third data in response to a second output control signal; and
 a third latch circuit configured to latch odd bits of the third data in response to a third output control signal.

26. A semiconductor memory device, comprising:
 a memory core;
 an input circuit configured to generate second data from first data using latch circuits operating in response to input control signals enabled during different periods, and configured to provide the second data to the memory core, the second data having 2N times a number of bits of the first data, where N is a positive integer; and
 an output circuit configured to generate fourth data from third data using latch circuits operating in response to output control signals enabled during different periods, and configured to provide the fourth data to data output pins, the fourth data having ½N times a number of bits of the third data, wherein
 the memory core includes:
  multi-memory banks and
  at least two input/output sense amplifiers, and
 the output circuit includes:
  a data converter configured to generate the fourth data based on fifth data outputted from a first input/output sense amplifier and sixth data outputted from a second input/output sense amplifier; and
  an output buffer configured to determine an output order of the fourth data and configured to convert parallel data to serial data based on the determined output order of the fourth data.

27. The semiconductor memory device of claim 26, wherein the data converter includes:
 a first latch circuit configured to latch the fifth data in response to a first input/output sense amplifier control signal, and configured to generate first latch data;
 a second latch circuit configured to latch the sixth data in response to a second input/output sense amplifier control signal, and configured to generate second latch data; and
 a plurality of selection circuits configured to generate each bit of the fourth data based on the first latch data and the second latch data in response to the output control signals.

28. The semiconductor memory device of claim 27, wherein the fifth data is 8-bit data, and the sixth data is 8-bit data.

29. The semiconductor memory device of claim 28, wherein the plurality of selection circuits include:
 a first selection circuit configured to select one bit from a first bit and a fifth bit of the first latch data and a first bit and a fifth bit of the second latch data, and configured to output the selected bit;
 a second selection circuit configured to select one bit from a second bit and a sixth bit of the first latch data and a second bit and a sixth bit of the second latch data, and configured to output the selected bit;
 a third selection circuit configured to select one bit from a third bit and a seventh bit of the first latch data and a third bit and a seventh bit of the second latch data, and configured to output the selected bit; and
 a fourth selection circuit configured to select one bit from a fourth bit and an eighth bit of the first latch data and a fourth bit and an eight bit of the second latch data, and configured to output the selected bit.

30. The semiconductor memory device of claim 28, wherein each of the plurality of the selection circuits includes:
 a switch circuit configured to select the one bit from the two bits of the first latch data and the two bits of the second latch data;
 a latch configured to latch output data of the switch circuit.

* * * * *